United States Patent
Matsui et al.

(10) Patent No.: US 8,703,004 B2
(45) Date of Patent: Apr. 22, 2014

(54) METHOD FOR CHEMICAL PLANARIZATION AND CHEMICAL PLANARIZATION APPARATUS

(75) Inventors: Yukiteru Matsui, Kanagawa-ken (JP); Masako Kodera, Kanagawa-ken (JP); Hiroshi Tomita, Kanagawa-ken (JP); Gaku Minamihaba, Kanagawa-ken (JP); Akifumi Gawase, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 69 days.

(21) Appl. No.: 13/423,018

(22) Filed: Mar. 16, 2012

(65) Prior Publication Data
US 2013/0119013 A1  May 16, 2013

(30) Foreign Application Priority Data
Nov. 14, 2011 (JP) .................................. 2011-248570

(51) Int. Cl.
*C03C 15/00* (2006.01)

(52) U.S. Cl.
USPC .................... 216/91; 216/53; 216/88; 216/89; 216/90; 438/689; 438/690; 438/691; 438/692; 438/693; 257/E21.23

(58) Field of Classification Search
None
See application file for complete search history.

(56) References Cited

U.S. PATENT DOCUMENTS

| | | | | |
|---|---|---|---|---|
| 4,671,851 A | * | 6/1987 | Beyer et al. | 438/426 |
| 2004/0053499 A1 | * | 3/2004 | Liu et al. | 438/689 |
| 2009/0095712 A1 | * | 4/2009 | Yamauchi et al. | 216/53 |

FOREIGN PATENT DOCUMENTS

| JP | 10-144652 | | 5/1998 | |
|---|---|---|---|---|
| JP | 2003-059866 | * | 2/2003 | H01L 21/304 |

OTHER PUBLICATIONS

K. Cheemalapati et al., "Key Chemical Components in Metal CMP Slurries", Chapter 7 in Microelectronic Applications of Chemical Mechanical Planarization, edited by Y. Li, John Wiley & Sons, 2008, p. 224.*

* cited by examiner

*Primary Examiner* — Lan Vinh
*Assistant Examiner* — Jiong-Ping Lu
(74) *Attorney, Agent, or Firm* — Finnegan, Henderson, Farabow, Garrett & Dunner, L.L.P.

(57) ABSTRACT

According to one embodiment, a method is disclosed for chemical planarization. The method can include forming a surface layer on a to-be-processed film having irregularity. The surface layer binds to or adsorbs onto the to-be-processed film along the irregularity to suppress dissolution of the to-be-processed film. The method can include planarizing the to-be-processed film in a processing solution dissolving the to-be-processed film, by rotating the to-be-processed film and a processing body while the to-be-processed film contacting the processing body via the surface layer, removing the surface layer on convex portions of the irregularity while leaving the surface layer on concave portions of the irregularity and making dissolution degree of the convex portions larger than dissolution degree of the concave portions.

20 Claims, 7 Drawing Sheets

METHOD FOR CHEMICAL PLANARIZATION AND CHEMICAL PLANARIZATION APPARATUS

CROSS-REFERENCE TO RELATED APPLICATIONS

This application is based upon and claims the benefit of priority from the prior Japanese Patent Application No. 2011-248570, filed on Nov. 14, 2011; the entire contents of which are incorporated herein by reference.

FIELD

Embodiments described herein relate generally to a method for chemical planarization and a chemical planarization apparatus.

BACKGROUND

In a semiconductor process, for example, in order to secure depth of focus (DOF) of lithography, it is desired that the surface of a to-be-processed object has high flatness.

Although there is a chemical mechanical polishing (CMP) technology as a processing technology for planarization, polishing damage (scratches) caused by abrasive grains (physical polishing agent) in a slurry to be used provides cause of yield reduction.

As a polishing method using no physical polishing agent, there is a method in which an ice layer embedding a concave-convex face therein is formed and the concave-convex face is polished while dissolving the ice layer from its surface. Furthermore, there is also a method for polishing a substrate, in which CMP polishing agent containing an insulating film-dissolving agent, an insulating-film-dissolution-protecting agent, and water therein is used, and in which the surface of a substrate is polished while preventing etching of a to-be-polished film and weakening the surface of the to-be-polished film during CMP polishing.

DETAILED DESCRIPTION

Figure 1:
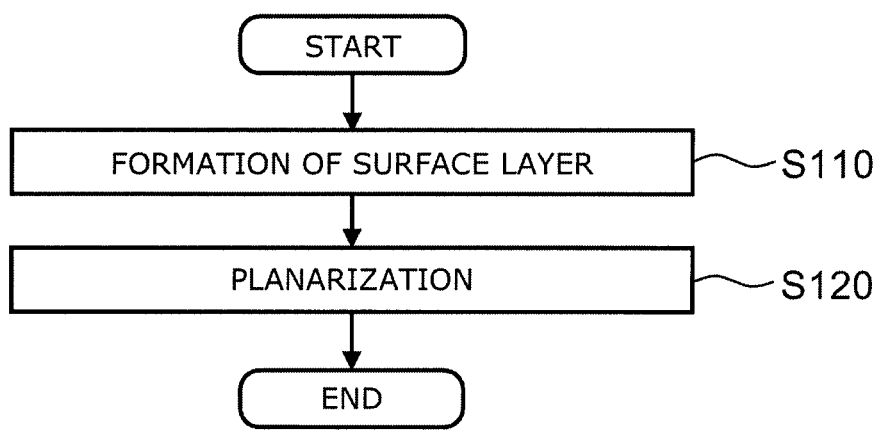
FIG. 1 is a flowchart view showing a method for chemical planarization according to a first embodiment.

According to one embodiment, a method is disclosed for chemical planarization. The method can include forming a surface layer on a to-be-processed film having irregularity. The surface layer binds to or adsorbs onto the to-be-processed film along the irregularity to suppress dissolution of the to-be-processed film. The method can include planarizing the to-be-processed film in a processing solution dissolving the to-be-processed film, by rotating the to-be-processed film and a processing body while the to-be-processed film contacting the processing body via the surface layer, removing the surface layer on convex portions of the irregularity while leaving the surface layer on concave portions of the irregularity and making dissolution degree of the convex portions larger than dissolution degree of the concave portions.

Various embodiments will be described hereinafter with reference to the accompanying drawings.

The drawings are schematic or conceptual; and the relationships between the thicknesses and widths of portions, the proportions of sizes among portions, etc., are not necessarily the same as the actual values thereof. Further, the dimensions and the proportions may be illustrated differently among the drawings, even for identical portions.

In the specification and the drawings of the application, components similar to those described in regard to a drawing thereinabove are marked with like reference numerals, and a detailed description is omitted as appropriate.

First Embodiment

FIG. 1 is a flowchart view illustrating a method for chemical planarization according to a first embodiment. FIGS. 2A to 2D are schematic cross-sectional views illustrating the method for chemical planarization according to the first embodiment.

Figure 2A:
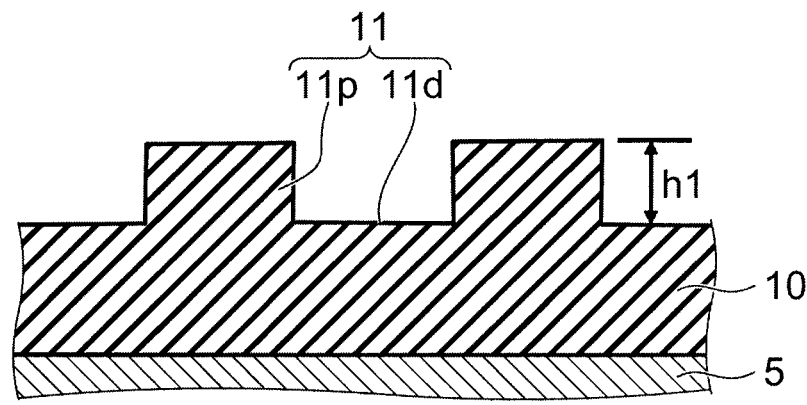
FIGS. 2A to 2D are schematic cross-sectional views showing the method for chemical planarization according to the first embodiment.

As shown in FIG. 2A, in the method for chemical planarization according to the embodiment, a to-be-processed film 10 has irregularity 11. The irregularity 11 has convex portions 11p and concave portions 11d.

Distance between the upper face of the convex portions 11p and the lower face of the concave portions 11d (depth h1 of the irregularity 11) is, for example, not less than 30 nanometers (nm) and not more than about 5000 nm.

A to-be-processed film 10 is, for example, a silicon oxide film (for example, silicon dioxide $SiO_2$ film). However, in the embodiment, a material of the to-be-processed film 10 is not limited to this, and any material can be used for the film 10. In the embodiment, the film 10 is formed by, for example, a CVD (chemical vapor deposition) method or a coating method.

The f to-be-processed film 10 is formed, for example, on the major surface of a base body 5. The base body 5 is, for example, a substrate etc. of semiconductor devices such as a semiconductor memory, a high-speed logic LSI, a system LSI, and a memory-logic hybrid LSI.

Figure 2B:
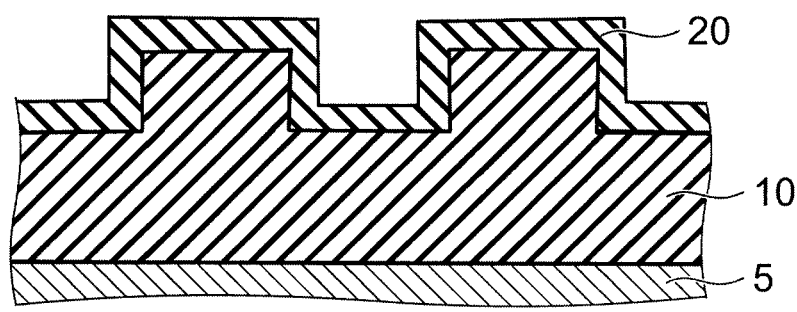

As shown in FIGS. 1 and 2B, according to the method, a surface layer 20 is formed on the to-be-processed film 10 having irregularity 11 (step S110). The surface layer 20 is located along the irregularity 11 of the film 10. The surface layer 20 is formed by binding to the to-be-processed film 10 or by adsorption such as chemical adsorption to the to-be-processed film 10. The surface layer 20 suppresses dissolution of the to-be-processed film 10. The surface layer 20 functions as, for example, a protective layer of the to-be-processed film 10.

As the surface layer 20, for example, at least any of a layer of a surfactant, a self-assembled monolayer, and a water repellent layer, is used. Examples of the surface layer 20 will be described later.

Figure 2C:
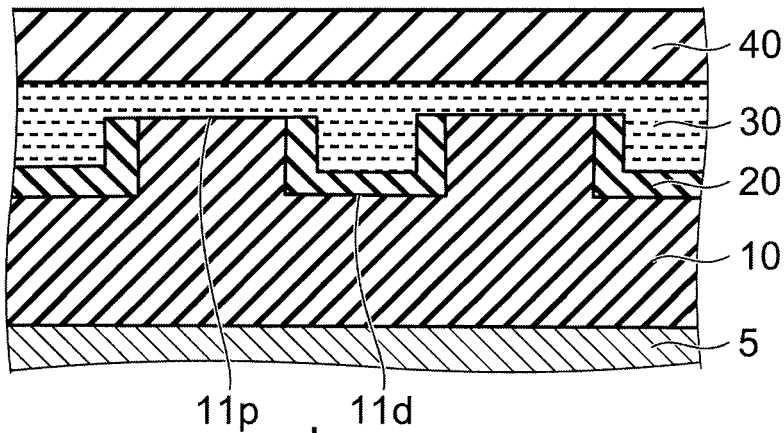
Figure 2D:
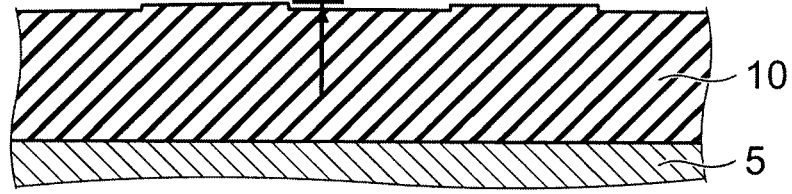

As shown in FIGS. 1 and 2C, the to-be-processed film 10 is planarized by removing the surface layer 20 on the convex portions 11p of the irregularity 11 and making the degree of the dissolution of the convex portions 11p of the irregularity 11 of the to-be-processed film 10 larger than the degree of the dissolution of the concave portions 11d of irregularity 11 (step S120). For example, the dissolution rate of the convex portions 11p is made larger than the dissolution rate of the concave portions 11d.

In a processing solution 30, the to-be-processed film 10 and the processing body 40 are brought into contact with each other via the surface layer 20. The processing solution 30 is a solution for dissolving the film 10. For example, when the film 10 is a $SiO_2$ film, the processing solution 30 can contain a hydrogen fluoride solution, an ammonium fluoride solution, or a strong alkaline solution. Because of this, the processing solution 30 dissolves the to-be-processed film 10.

The processing body 40 is, for example, a polishing pad. The processing body 40 contains, for example, a resin material. Furthermore, the processing body 40 can contain, for example, a catalyst material.

In the processing solution 30, the to-be-processed film 10 and the processing body 40 are rotated while being brought into contact with each other. That is, the relative position of the to-be-processed film 10 and the processing body 40 is changed. For example, at least any of the to-be-processed film 10 and the processing body 40 is rotated while being brought into contact with each other via the surface layer 20. The axis of the rotation is in a direction perpendicular to a plane on which the to-be-processed film 10 and the processing body are brought into contact with each other. By the above-mentioned change of relative position (for example, rotation), the surface layer 20 on the upper face of the convex portions 11p of the irregularity 11 is removed, while leaving the surface layer 20 on the lower face of the concave portions 11d of the irregularity 11. That is, the surface layer 20 on the convex portions 11p of the irregularity 11 is selectively removed.

Because of this, a state in which the concave portions 11d are covered with the surface layer 20, and the upper face of the convex portions 11p is exposed from the surface layer 20, can be obtained. Then, the convex portions 11p are brought into contact with the processing solution 30, and the convex portions 11p are dissolved by the processing solution 30. In contrast, since the concave portions 11d is covered with the surface layer 20 and does not contact the processing solution 30, the concave portions 11d cannot be dissolved easily. That is, the dissolution degree of the convex portions 11p of the irregularity 11 of the to-be-processed film 10 becomes larger than the dissolution degree of the concave portions 11d of the irregularity 11. The film 10 is planarized by advancing the dissolution of the film 10 in this state. That is, the depth h2 of the irregularity of the to-be-processed film 10 after being subjected to planarization (step S120) becomes smaller than the depth h1 of the irregularity before the treatment. In this way, after planarization treatment, a state in which the depth (size) of the irregularity after being processed is smaller than the initial depth (size) of the irregularity can be obtained.

In the embodiment, the processing solution 30 contains substantially no abrasive grain. Because of this, generation of scratches caused by abrasive grains is suppressed.

For example, in a mechanical polishing method (such as lapping), processing is carried out selectively from the convex portions 11p of the to-be-processed film 10, and a flat surface is obtained when the convex portions 11p substantially disappear. For this reason, the thickness of polishing is almost equivalent to the depth h1 of the irregularity, and thus planarization can be carried out efficiently. However, by the mechanical polishing method, the damage on the surface of the film 10 is great, and a damage layer deteriorated by processing is formed. For this reason, the method cannot be applied to minute elements required to have high characteristics and high accuracy.

Furthermore, for example, in CMP of a $SiO_2$ film, there is also a configuration in which a slurry obtained by adding surfactant to $CeO_2$ abrasive grains is also used. In CMP, since a wafer is planarized while being directly and mechanically brought into contact with a polishing pad, defects tend to be generated on the surface of the wafer after polishing. Especially, it is known that, as the wafer size becomes smaller, scratches caused by the abrasive grains in the slurry become a factor that reduces yield.

In contrast, in, for example, chemical polishing methods (wet etching etc.) using no abrasive grain, isotropic etching using, for example, an etchant, is carried out. In the method, mechanical damage is not generated on the surface of the to-be-processed film 10. However, the etching rate of the convex portions 11p is not so different from the etching rate of the concave portions 11d, and thus in order to achieve a flat surface, etching to a depth significantly larger than the depth h1 of the irregularity 11 is required. For this reason, amount of processing required for planarization is large, thereby resulting in low efficiency. Furthermore, in some cases, flatness may be even more degraded than ever by etch-pits.

In contrast, in the embodiment, the surface of the irregularity 11 of the to-be-processed film 10 is covered with the surface layer 20, and then, the surface layer 20 on the convex portions 11p is selectively removed. In this way, it is possible to make the dissolution degree of the convex portions 11p of the irregularity 11 of the film 10 larger than the dissolution degree of concave portions 11d of the irregularity 11. Because of this, the thickness of the film 10 to be removed for planarization may be substantially the same as the depth h1 of the irregularity 11, resulting in high efficiency of planarization.

As a method for chemical planarization of a to-be-processed film such as a SiC film or a GaN film, for example, there is a method in which SiC or GaN is brought into contact with a catalytic plate of Pt etc. in a hydrogen fluoride solution. In the method, reacting species which are active only on the surface of the catalytic plate are generated, and only the concave portions of the to-be-processed film are selectively etched, and thus planarization advances. However, materials to which the method is applicable are limited to materials such as SiC and GaN, and the method cannot be applied to the planarization of a to-be-processed film made up of any material including $SiO_2$ etc.

In contrast, in the chemical planarization method according to the embodiment, the material of the to-be-processed film 10 is not limited, and the method can be applied to the planarization of a film such as a $SiO_2$ film required to have high accuracy. That is, the processing solution 30 for dissolving the film 10 is chosen appropriately, and the surface layer 20 located along the irregularity 11 of the film 10 is used. By rotating the film 10 and the processing body 40 while bringing them into contact with each other via the surface layer 20, the surface layer 20 on the convex portions 11p is selectively removed while leaving the surface layer 20 on the concave portions 11d. This makes the dissolution degree of the convex portions 11p of the film 10 larger than the dissolution degree of the concave portions 11d of the film 10. Because of this, the film 10 is planarized. In this way, a to-be-processed film 10 made up of any material can be planarized effectively in high accuracy.

As a method not using physical polishing agent, in a method in which an ice layer for embedding an concave-convex face therein is formed, and the surface is polished while dissolving the ice layer from its surface, fine structures included in the to-be-processed film 10 and a base body 5 may be destroyed by, for example, thermal expansion or thermal shrinkage generated in the film 10 by temperature change accompanied with the formation and the dissolution of the ice layer. Furthermore, due to unevenness of temperature in a surface (also including unevenness of, for example, frictional heat), it is very difficult to embed a fine concave-convex face in an ice layer and to uniformly dissolve the ice layer from its surface. In addition, the ice layer is merely placed on the film 10, and does not bind to or adsorb onto the film 10. For this reason, the ice layer cannot exist on the film 10 stably, and thus it is difficult to carry out stable planarization.

Furthermore, in a method using CMP abrasive containing an insulating film-dissolving agent, an insulating-film-dissolution-protection agent and water, the purpose is to prevent the to-be-polished film from being etched by the dissolution protection agent and to weaken the surface of the to-be-polished film during CMP polishing, and thus it is difficult to change the dissolution rate between the convex portions 11p and the concave portions 11d. For this reason, it is difficult to planarize the to-be-processed film 10 efficiently with a high degree of accuracy.

In the embodiment, by forming the surface layer 20 binding to or adsorbing onto the to-be-processed film 10 on the film 10 along the irregularity 11 of the film 10, the surface layer 20 can be formed stably. In this way, changing the dissolution rate between the convex portions 11p and concave portions 11d can be achieved with sufficient reproducibility.

Since being applicable to planarization of a $SiO_2$ film for forming a device isolation region or a pre-metal insulating film in a silicon-based semiconductor process, the chemical planarization method according to the embodiment has a large utility value.

According to the chemical planarization method according to the embodiment, an efficient chemical planarization method capable of suppressing generation of scratches can be provided. Hereinafter, several examples according to the embodiment will be described.

FIRST EXAMPLE

FIGS. 3A to 3D are schematic cross-sectional views illustrating a method for chemical planarization according to a first example.

Figure 3A:
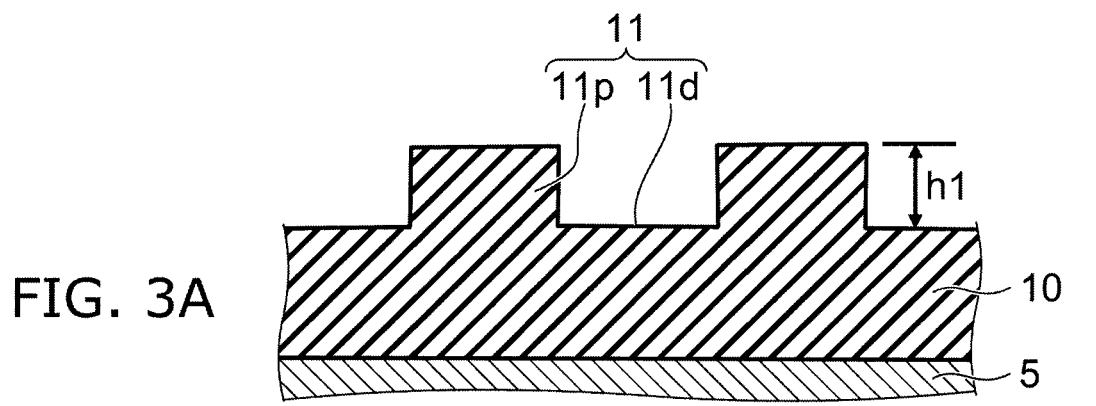
FIGS. 3A to 3D are schematic cross-sectional views showing a method for chemical planarization according to a first example.

For example, as shown in FIG. 3A, the to-be-processed film 10 made up of a $SiO_2$ film is formed on a silicon substrate (base body 5) which is not shown in the figure. On the major surface of the silicon substrate, an element such as, for example, a transistor, is formed. Such an element has irregularity, and the film 10 is formed so as to embed the irregularity therein. The film 10 is formed by, for example, a CVD method or a coating method, so as to planarize irregularity derived from the element, but irregularity 11 exists on the film 10.

Figure 3B:
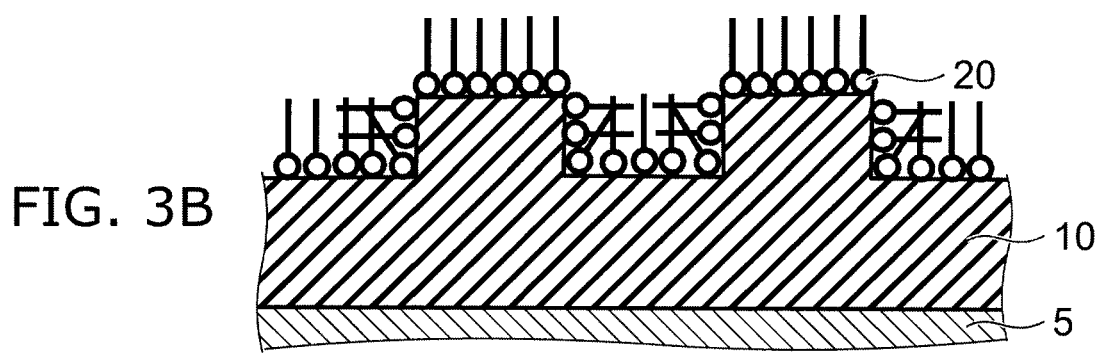

As shown in FIG. 3B, as the surface layer 20, surfactant adsorbs onto the to-be-processed film 10. The surfactant (surface layer 20) adsorbed onto the surface of the film 10 acts as a surface protection film. As the surfactant, an anionic surfactant, a cationic surfactant, an amphoteric surfactant and a non-ionic surfactant can be used. Furthermore, the surfactant can be selected among surfactants of an anionic surfactant, an anionic surfactant with a non-ionic part, a cationic surfactant, an amphoteric-based surfactant and a non-ionic-based surfactant. As a functional group preferably used for the surfactant, for example, functional groups of, such as, carboxylic acid type, sulfonic acid type, sulfate ester type, phosphate ester type, amine salt type, quarternary ammonium salt type, ether type, ester type, alkanolamide type, carboxybetaine type, and glycine type, may be included.

For example, the surfactant can have a polarity opposite to the polarity of the to-be-processed film 10. Because of this, the surfactant can be strongly adsorbed by the film 10 by means of an electric interaction. Thus, the surface layer 20 can be formed stably. For example, when the film 10 is a $SiO_2$ film, it is preferable to use a cationic surfactant for a surfactant acting as the surface layer 20.

Because of this, the surfactant more strongly adsorbs onto the surface of the film 10 made up of $SiO_2$ by means of an electric interaction. Thus, when a surfactant is used as the surface layer 20, the surface layer 20 chemically adsorbs onto the film 10. That is, in the embodiment, formation of the surface layer 20 can include forming a layer of a surfactant on the film 10.

Figure 3C:
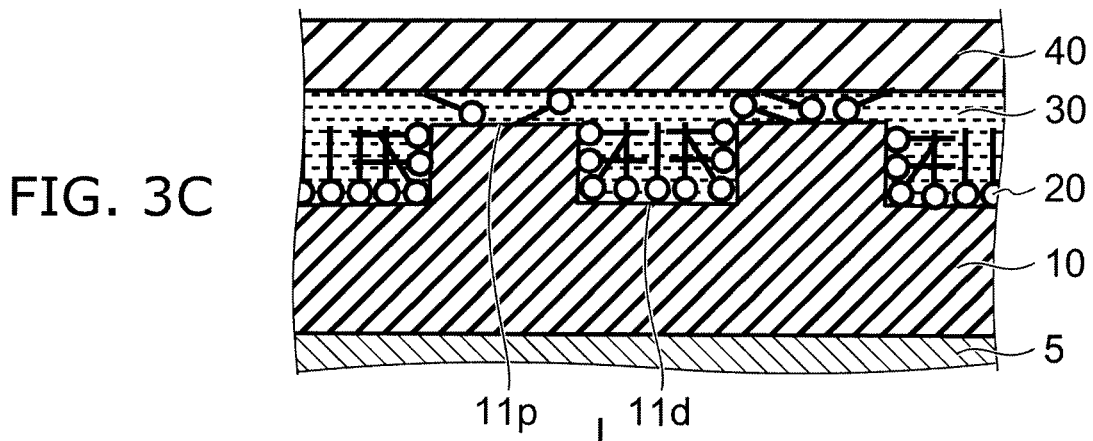
Figure 3D:
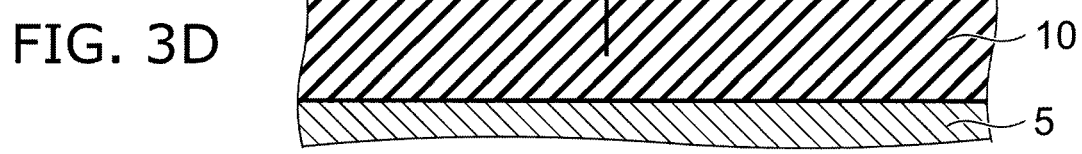

As shown in FIG. 3C, while being brought into contact with each other via the surface layer 20, the to-be-processed film 10 and the processing body 40 are rotated in a processing solution 30. As the processing solution 30, for example, solutions of potassium hydroxide, ammonia, and the like are used. PH of the processing solution 30 is about ten, and thus the processing solution 30 is a strong alkaline solution. In the processing solution 30, planarization processing of the film 10 ($SiO_2$ film) is carried out by bringing the processing body 40 into contact with the film 10 while rotating any of the film 10 and the processing body 40. As the processing body 40, for example, a polishing pad made up of a urethane resin is used.

At that time, as shown in FIG. 3C, the concave portions 11d of the to-be-processed film 10 are protected by the surface layer 20 made up of the surfactant, and thus dissolution of the concave portions 11d is suppressed even in a strong alkaline solution. In contrast, with regard to the convex portions 11p, the surfactant secedes from the upper face of the convex portions 11p, and the $SiO_2$ film of the convex portions 11p are exposed due to contact between the urethane resin and the processing body 40. If adsorbed amount of the surfactant is large, the dissolution rate of the film 10 by the processing solution 30 will be low. For this reason, in the convex portions 11p, dissolution is advanced by the strong alkaline solution. In this way, the convex portions 11p are selectively dissolved and planarization is chemically advanced.

In the first example, processing selection ratio of the convex portions 11p to the concave portions 11d is high. For this reason, high flatness can be achieved efficiently. In addition, since no abrasive grain is used, generation of scratches is suppressed.

SECOND EXAMPLE

In a second example, as a surface layer 20, polyvinyl pyrrolidone (PVP) (cationic surfactant) is formed on the surface of the to-be-processed film 10 made up of $SiO_2$ (refer to FIG. 3C). In the embodiment, since the cationic surfactant is used, the surface layer 20 easily adsorbs onto the film 10 made up of $SiO_2$ of which surface is charged in negative, and thus the surface layer 20 can be formed easily. Other than above, as a cationic surfactant, polyethyleneimine (PEI) can also be used.

The weight average molecular weight (Mw) in terms of polyethylene glycol of PVP used in the embodiment, measured by water-based GPC (gel permeation chromatography) is not less than 20,000, preferably, not less than 200,000 and not more than 1,500,000, and more preferably, not less than 300,000 and not more than 1,500,000. If the weight average molecular weight is within the above ranges, friction due to contact with the processing body 40 made up of a urethane resin can be reduced. When a surfactant is used, the protection effect is higher as the weight average molecular weight becomes larger.

In another way, for example, it is possible to mix first PVP having weight average molecular weight of not less than 200,000 and second PVP having weight average molecular weight of not more than 20,000. In this way, protection from the processing solution 30 can be carried out by the first PVP having a relatively larger molecular weight, and the to-be-processed film 10 can be densely covered with the surface layer 20 by the second PVP having a relatively smaller molecular weight.

The weight average molecular weight (Mw) of PEI in terms of polyethylene glycol, measured by water-based GPC is not less than 10,000, preferably, not less than 100,000 and not more than 1,000,000. If the weight average molecular weight is within the above ranges, friction due to contact with the processing body 40 made up of a urethane resin can be reduced.

Furthermore, as shown in FIG. 3C, the concave portions 11$d$ of the to-be-processed film 10 are protected by the surface layer 20 made up of a cationic surfactant, and thus their dissolution by the processing solution 30 is suppressed. In contrast, with regard to the convex portions 11$p$, by contact with the processing body 40 made up of a urethane resin, the cationic surfactant is seceded from the upper face of the convex portions 11$p$, and thus the $SiO_2$ film of the convex portions 11$p$ is exposed. If the adsorbed amount of the surfactant on the surface of the film 10 is large, the dissolution rate of the film 10 by the processing solution 30 is low. For this reason, dissolution of the convex portions 11$p$ is advanced by a mixed solution of hydrogen fluoride and ammonium fluoride. In this way, the convex portions 11$p$ are dissolved selectively, and planarization is advanced chemically.

THIRD EXAMPLE

In the example, two kinds of surfactants are used for forming a surface layer 20. By using a cationic surfactant as a first surfactant and using an anionic surfactant as a second surfactant, the surface layer 20 is formed on the to-be-processed film 10 (refer to FIG. 3C). By mixing the cationic surfactant and the anionic surfactant, the protection effect for the surface layer 20 can be enhanced further than in a case in which no anionic surfactant is used, by means of an electric interaction or a hydrophobic interaction.

The first cationic surfactant used for the example is, for example, polyvinyl pyrrolidone (PVP) or polyethyleneimine (PEI).

When, as the anionic second surfactant, for example, polyacrylic acid (PAA) is used, for example, the weight average molecular weight (Mw) in terms of polyethylene glycol measured by GPC can be applied as the weight average molecular weight (Mw) of PAA. The weight average molecular weight Mw of PAA may be not less than 2,000 and not more than 5000,000, preferably, not less than 4,000 and not more than 100,000. Since the second surfactant is an anionic surfactant, its effect of suppressing dissolution is small by itself.

Furthermore, in order to suppress the dissolution, the protection effect of the first surfactant becomes higher as the weight average molecular weight becomes larger, but it is preferable that the second surfactant has a relatively small weight average molecular weight. For example, when first surfactant PEI having a weight average molecular weight of 1000,000 and second surfactant PAA having a weight average molecular weight of 4,000 are mixed, the to-be-processed film 10 can be covered with the mixture more densely, thereby allowing the further suppression of friction and dissolution of the film 10.

As shown in FIG. 3C, the concave portions 11$d$ of the to-be-processed film 10 is protected by the surface layer 20 including the cationic first surfactant and the anionic second surfactant, and thus its dissolution by the processing solution 30 is suppressed. In contrast, with respect to the convex portions 11$p$, by the contact with the processing body 40 made up of a urethane resin, the first and the second surfactants are eliminated from the upper face of the convex portions 11$p$, and thus the $SiO_2$ film of the convex portions 11$p$ is exposed. If the adsorbed amount of the surfactants is large on the surface of the film 10, the dissolution rate of the film 10 by the processing solution 30 is low. For this reason, dissolution at the convex portions 11$p$ proceeds by the mixed solution of hydrogen fluoride and ammonium fluoride. Therefore, the convex portions 11$p$ are selectively dissolved and the planarization is advanced chemically.

First Comparative Example

In a first comparative example, a surface layer 20 is not formed, silica abrasive grains are used, and an alkaline solution with pH of 8 is used. In the solution, planarization of the $SiO_2$ film by CMP is carried out by using the processing body 40 made up of a urethane resin. In the case, flatness is good, but scratches caused by abrasive grains are generated.

Second Comparative Example

In a second comparative example, a surface layer 20 is not formed and an alkaline solution of pH 7 using a slurry obtained by adding a surfactant to ceria abrasive grains is used. In the solution, planarization of a $SiO_2$ film by means of CMP is carried out by using a processing body 40 made up of a urethane resin. In the case, although flatness higher than the flatness in the first example can be achieved, scratches caused by abrasive grains are generated.

Third Comparative Example

In a third example, the surface layer 20 is not formed, abrasive grains are not used, and wet etching of an $SiO_2$ film is carried out in a strong alkaline solution of pH 10. At that time, a processing body 40 is not used. In the case, no scratch is generated, but flatness is low. This is because dissolution advances isotropically in both of the concave portions 11$d$ and the convex portions 11$p$.

Fourth Comparative Example

In a fourth comparative example, a surface layer 20 is not formed, and wet etching of a $SiO_2$ film is carried out in hydrogen fluoride without using abrasive grains. At that time, a processing body 40 is not used. In the case, although no scratch is generated, flatness of the film is low. This is because dissolution advances isotropically in both of the concave portions 11$d$ and the convex portions 11$p$.

FOURTH EXAMPLE

In a fourth example, a self-assembled monolayer (SAM) is formed on the surface of the to-be-processed film 10 made up of $SiO_2$ as a surface layer 20. In this way, the formation of the surface layer 20 can include forming a self-assembled monolayer on the film 10.

Self-assembling molecules adsorb in a direction in which reactive functional groups direct to the surface of the $SiO_2$ film. For example, when the self-assembling molecules have long-chain alkyl groups, van der Waals force and an interaction between hydrophobic groups work. For example, when the self-assembling molecules have a benzene ring, a n electron interaction acts. Such molecules are thermally stabilized when adsorbed molecules are assembled, and thus a monolayer in which molecules are densely integrated is formed.

By using the self-assembled monolayer as a surface layer 20, wet etching of the to-be-processed film 10 by the processing solution 30 is suppressed. The surface layer 20 using the self-assembled monolayer covers the to-be-processed film 10 more densely than in the case in which a surfactant is used. For this reason, the effect of protecting the film 10 from the processing solution 30 is large.

As a method for forming a self-assembled monolayer on the surface of a $SiO_2$ film, for example, a silane coupling reaction can be utilized. For example, when the surface of the $SiO_2$ film is treated by organic silane, the silane coupling reaction by which organic silane molecules are fixed by covalent bonding occurs. At that time, the surface of the $SiO_2$ film is bonded by siloxane bond (Si—O—Si). That is, the surface layer 20 binds to the to-be-processed film 10. In this way, formation of the surface layer can include generating the silane coupling reaction.

In the example, as a processing solution 30, a hydrogen fluoride solution is used, and as a processing body 40, a plate of Pt (platinum) is used. The Pt plate functions as a catalyst. Planarization processing is carried out in the hydrogen fluoride solution, by rotating at least any of the $SiO_2$ film (to-be-processed film 10) and the Pt plate (processing body 40) while bringing them into contact with each other via the surface layer 20. At that time, at the concave portions 11d of the $SiO_2$ film, dissolution by the hydrogen fluoride solution is suppressed by modification/protection of the surface layer 20 made up of the self-assembled monolayer.

In contrast, near the Pt plate (catalyst) of the convex portions 11p, by a reaction according to the following formula (1), a hydroxyl radical (OH*) is generated.

$$F^*+H_2O \rightarrow OH^*+HF \quad (1)$$

Figure 4:
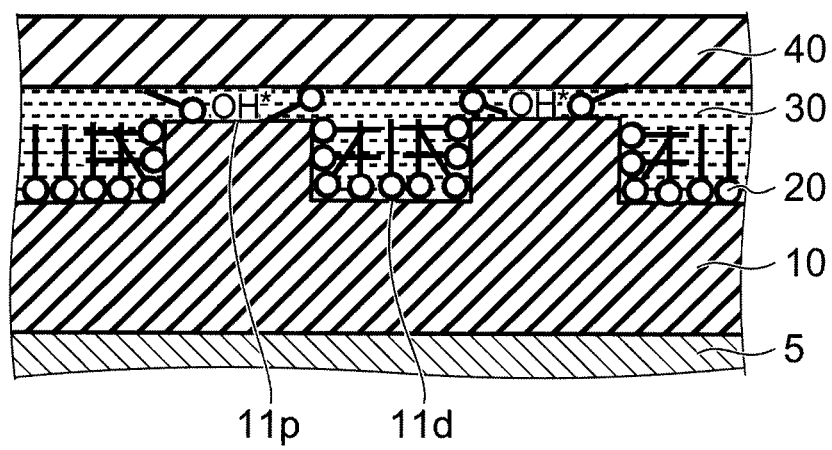
FIG. 4 is a schematic cross-sectional view showing a method for chemical planarization according to the fourth embodiment.

FIG. 4 is a schematic cross-sectional view illustrating a method for chemical planarization according to the fourth embodiment.

FIG. 4 schematically illustrates a state of generation of the hydroxyl radical (OH*) near the Pt plate (catalyst) of the convex portions 11p. At the convex portions 11p contacting the catalyst of the Pt plate (processing body 40), the siloxane bond is broken by oxidation due to the hydroxyl radical, and $SiO_2$ is formed. Then $SiO_2$ is dissolved by the following formula (2).

$$SiO_2+6HF \rightarrow H_2SiF_6+2H_2O \quad (2)$$

As the result, the convex portions 11p are dissolved selectively, and planarization is advanced chemically. When the amount of the self-assembled monolayer is large on the to-be-processed film 10, the dissolution rate of the film 10 by the processing solution 30 is low.

In the fourth example, the processing selection ratio of the convex portions 11p to the concave portions 11d is high. For this reason, high flatness can be achieved efficiently. In addition to this, since no abrasive grain is used, generation of scratches is suppressed.

FIFTH EXAMPLE

In a fifth example, a self-assembled monolayer is used as a surface layer 20, and $TiO_2$ is used as a processing body 40. $TiO_2$ functions as a photocatalyst.

For example, in a strong alkaline solution having pH of about ten, planarization of a $SiO_2$ film is carried out by bringing the $SiO_2$ film and a $TiO_2$ plate into contact with each other via the surface layer 20 made up of a self-assembled monolayer and rotating at least any of them. At that time, the surface of the $TiO_2$ plate is irradiated with light containing UV light. At the concave portions 11d of the $SiO_2$ film, dissolution by the strong alkaline solution is suppressed by modification/protection by the surface layer 20 made up of the self-assembled monolayer.

In contrast, near the $TiO_2$ plate (catalyst) of the convex portions 11p, holes are formed by the photocatalyst effect of $TiO_2$ and hydroxyl radicals are generated by the following formulas (3) and (4).

$$TiO_2+hv \rightarrow e^-+h^+ \quad (3)$$

$$OH^-+h^+ \rightarrow OH^* \quad (4)$$

At the convex portions 11p contacting the catalyst, a siloxane bond is broken by oxidation caused by hydroxyl radicals and $SiO_2$ is formed on the surface of the convex portions 11p. Then, the $SiO_2$ film is dissolved by a processing solution 30 that is a strong alkaline solution. As a result, the convex portions 11p are dissolved selectively, and planarization is advanced chemically.

In the fifth example, since the processing selection ratio of the convex portions 11p to the concave portions 11d is also high, high flatness can be achieved efficiently. In addition, since no abrasive grain is used, generation of scratches is suppressed. The self-assembled monolayer used as the surface layer 20 can be removed after planarization processing, by means of, for example, ashing.

SIXTH EXAMPLE

In a sixth example, a water-repellent treated layer is used as the surface layer 20. For example, as a treatment of forming the surface layer 20, for example, silylation processing by tetramethyl silyldiethylamine (TMSDMA) is carried out. Then, a Mo (molybdenum) plate is used as a processing body 40. The Mo plate functions as a catalyst. A hydrogen fluoride solution is used as a processing solution 30.

In the hydrogen fluoride solution, via the surface layer 20 that is the water-repellent treated layer, planarization processing is carried out by bringing the $SiO_2$ film and the Mo plate into contact with each other and rotating at least any of them. At that time, at the concave portions 11d of the $SiO_2$ film, dissolution by hydrogen fluoride is suppressed by the surface layer 20 of the water-repellent treated layer. At the surface of the to-be-processed film 10, when the amount of the water repellent processed layer is large (when the degree of water repellency of the $SiO_2$ film is high), the dissolution rate of the film 10 by the processing solution is low.

Hydroxyl radicals are generated by the reaction of formula (1) near the Mo plate of the convex portions 11p. At the convex portions 11p contacting the Mo plate that is a catalyst, a siloxane bond is broken by oxidization caused by hydroxyl radicals and $SiO_2$ is formed on the surface of the parts 11p. $SiO_2$ is dissolved by the reaction of formula (2). As the result, the convex portions 11p are dissolved selectively, and the planarization is advanced chemically.

In the sixth example, since the processing selection ratio of the convex portions 11p to the concave portions 11d is also high, high flatness can be achieved efficiently. In addition, since no abrasive grain is used, generation of scratches is suppressed.

SEVENTH EXAMPLE

In a seventh example, a water-repellent treated layer using hexamethyl disilazane (HMDS) is used as a surface layer 20.

In addition, a Pt plate is used as a processing body 40, and a hydrogen fluoride solution is used as a processing solution 30.

In the case, near the Pt plate of the convex portions 11p, hydroxyl radicals are also generated by the reaction of formula (1), and the convex portions 11p are dissolved selectively, and the planarization is advanced chemically. In the seventh embodiment, since the processing selection ratio of the convex portions 11p to the concave portions 11d is also high, high flatness can be achieved efficiently. In addition, since no abrasive grain is used, generation of scratches is suppressed.

In this way, the formation of the surface layer 20 can include subjecting the to-be-processed film 10 to water repellent treatment. Subjecting the film 10 to water repellent treatment can include performing treatment using at least any of tetramethyl silyldiethylamine and hexamethyl disilazane.

The catalyst material used for the processing body 40 can contain at least any of Pt and Mo. In addition, the catalyst material contains $TiO_2$, and the planarization process can include irradiating the to-be-processed film with UV light.

In this way, the chemical planarization method according to the first embodiment, includes: forming a surface layer 20 (protection film) for suppressing the dissolution of a $SiO_2$ film on the $SiO_2$ film (to-be-processed film 10) having irregularity 11; and planarizing the $SiO_2$ film in a processing solution 30 dissolving the $SiO_2$ film by bringing the $SiO_2$ film and the processing body 40 into contact with each other while rotating at least any of them. Because of this, a chemical planarization method capable of achieving high flatness in a scratch-free manner, by chemically processing a $SiO_2$ film having irregularity 11, can be provided.

Second Embodiment

In a second embodiment, a processing solution 30 contains a raw material for forming a surface layer 20. A process of forming of the surface layer 20 (step S110) include forming the surface layer 20 from the raw material by bringing the processing solution 30 containing the raw material for forming the surface layer 20 and a to-be-processed film 10.

FIGS. 5A to 5D are schematic cross-sectional views illustrating a chemical planarization method according to the second embodiment.

Figure 5A:
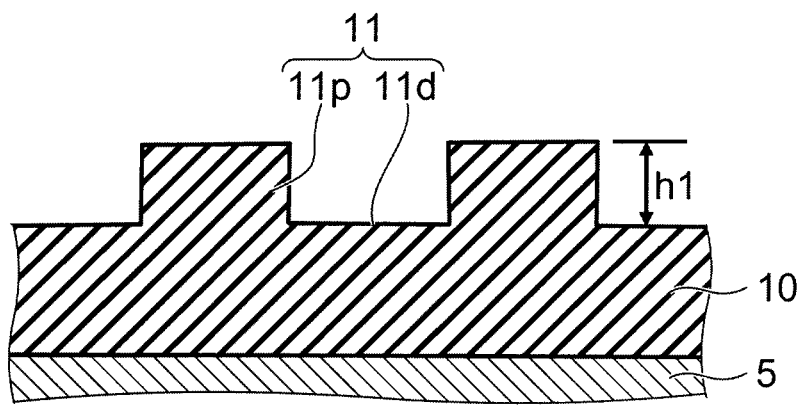
FIGS. 5A to 5D are schematic cross-sectional views showing a method for chemical planarization according to a second embodiment.

For example, as shown in FIG. 5A, the to-be-processed film 10 having irregularity 11 is used. As the film 10, for example, a $SiO_2$ film is used.

Figure 5B:
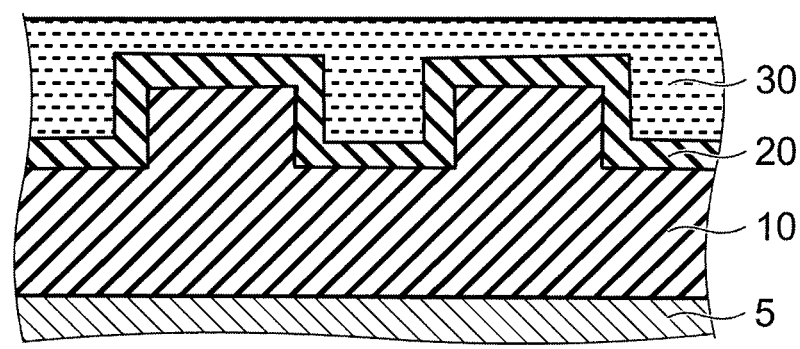

As shown in FIG. 5B, for example, the processing solution 30 containing a surfactant (the raw material of the surface layer 20) and the to-be-processed film 10 are brought into contact with each other. The surfactant in the processing solution 30 adsorbs onto the surface of the film 10, and the surface layer 20 is formed.

Figure 5C:
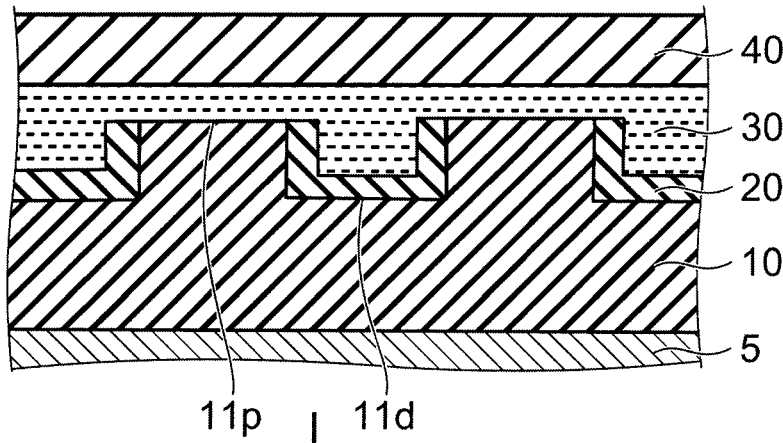
Figure 5D:
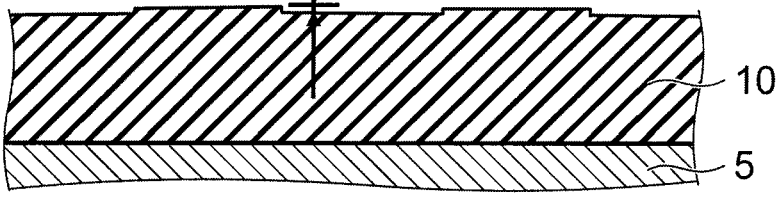

As shown in FIG. 5C, the to-be-processed film 10 and the processing body 40 (for example, a urethane resin) are rotated while being brought into contact with each other via the surface layer 20 in the processing solution 30. In this way, the surface layer 20 on the convex portions 11p of the irregularity 11 are removed, while leaving the surface layer 20 (surfactant) on the concave portions 11d. The convex portions 11p contact with the processing solution 30, and they are dissolved by the processing solution 30. In contrast, since the concave portions 11d are covered with the surface layer 20 and thus do not contact with the processing solution 30, the concave portions 11d are not dissolved easily.

In the second embodiment, since the processing selection ratio of the convex portions 11p to the concave portions 11d is also high, high flatness can be achieved efficiently. In addition, since no abrasive grain is used, generation of scratches is suppressed. According to the embodiment, since a surface layer 20 is formed with a raw material in a processing solution 30, a process of forming the surface layer 20 can be simplified.

As described above, in the chemical planarization method according to the second embodiment, the surface layer 20 is formed on the $SiO_2$ film by bringing the $SiO_2$ film (to-be-processed film 10) having the irregularity 11 and the processing solution 30 into contact with each other. The processing solution 30 contains a component becoming as the surface layer 20 for suppressing dissolution of the $SiO_2$ film, and a component for dissolving the $SiO_2$ film. In addition, the method includes a process of planarizing the $SiO_2$ film in the processing solution 30 by bringing the $SiO_2$ film and a processing body 40 into contact with each other while rotating at least any of them. In this way, a chemical planarization method capable of achieving high flatness in a scratch free manner, by chemically processing the $SiO_2$ film having the irregularity 11, can be provided.

The chemical planarization methods described in the first and second embodiments, can be used for manufacturing semiconductor devices, such as, for example, a semiconductor memory, a high-speed logic LSI, a system LSI, and a memory-logic hybrid LSI.

Third Embodiment

A third embodiment relates to a method for manufacturing an electronic apparatus. The electronic apparatus includes, for example, a semiconductor device containing a semiconductor layer. As the semiconductor device, for example, a semiconductor memory, a high-speed logic LSI, a system LSI, and a memory-logic hybrid LSI are included. The electronic apparatus can also include a device such as MEMS (Micro Electro Mechanical Systems).

Figure 6:
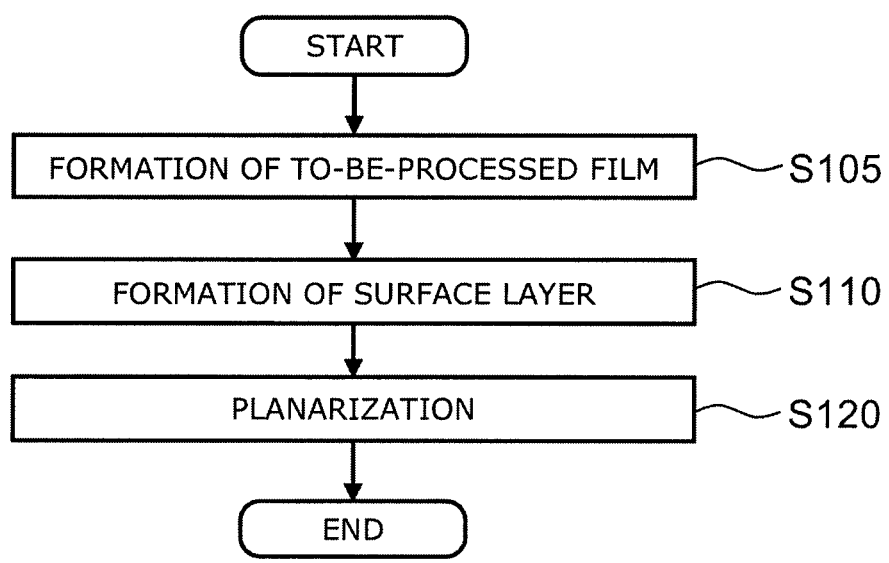
FIG. 6 is a flowchart view showing a method for manufacturing an electronic apparatus according to a third embodiment.

FIG. 6 is a flowchart view illustrating the method for manufacturing the electronic apparatus according to the third embodiment.

As shown in FIG. 6, the manufacturing method includes a process of forming a to-be-processed film 10 on a base body 5 (step S105). The method further includes steps S110 and S120. That is, the method can further include a process of subjecting the film 10 to the chemical planarization method described in the first and the second embodiments.

In the manufacturing method, by using the chemical planarization method capable of achieving planarization efficiently while suppressing generation of scratches, a high performance electronic apparatus having a fine element can be manufactured with a high yield.

Fourth Embodiment

Figure 7:
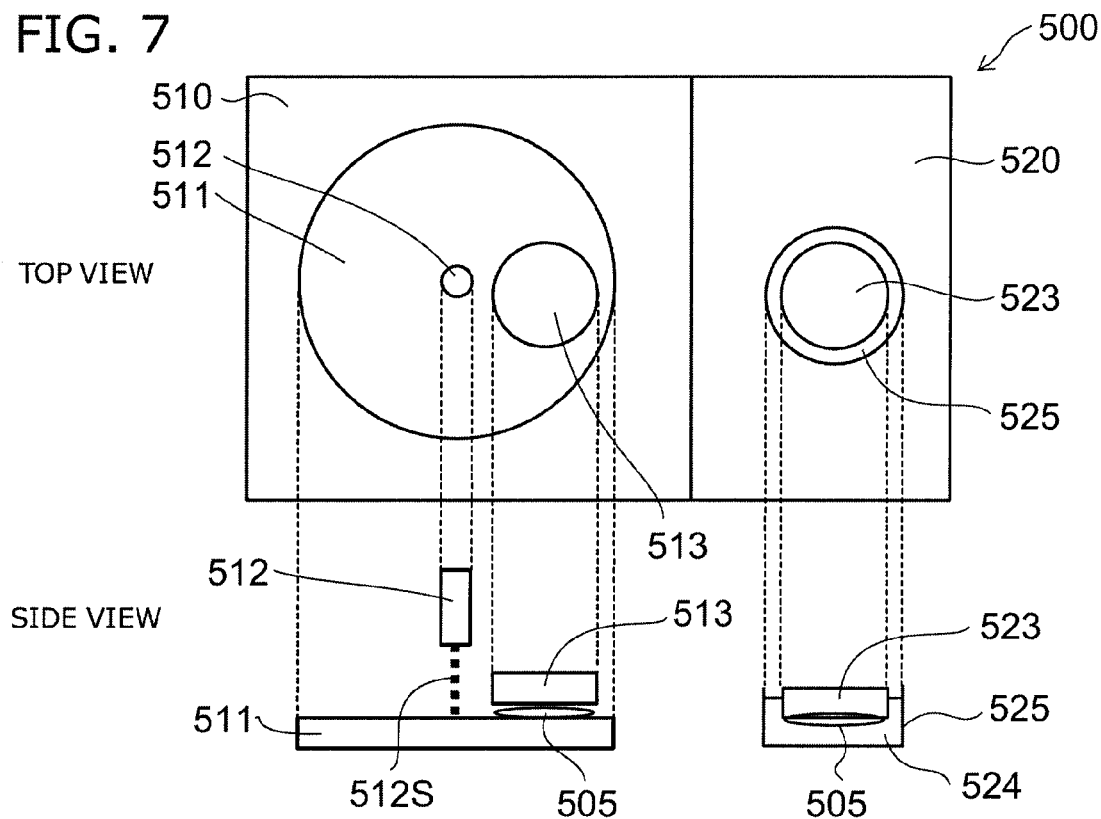
FIG. 7 is a schematic view showing a chemical planarization apparatus according to a fourth embodiment.

FIG. 7 is a schematic view illustrating a chemical planarization apparatus according to a fourth embodiment.

As shown in FIG. 7, a chemical planarization apparatus 500 according to the embodiment includes a pretreatment unit 520 and a polishing treatment unit 510.

The pretreatment unit 520 includes a vessel 525 and a head 523. The head supports a wafer 505. A pretreatment solution 524 can be housed in the vessel 525. The wafer 505 is caused to be contact the pretreatment solution 524. This performs the pretreatment.

The polishing treatment unit 510 includes a pad 511 (platen), a slurry nozzle 512 and a head 513. The head 513 supports the wafer 505 (base body 5). A slurry 512s is supplied from the slurry nozzle 512 toward the pad 511. The pad 511 is opposed to the wafer 505 via the slurry 512s. While rotating the pad 511, the wafer 505 is rotated. This performs the polishing treatment.

In the chemical planalization apparatus 500, the following can be possible, forming a surface layer on a to-be-processed film having irregularity, the surface layer binding to or adsorbing onto the to-be-processed film along the irregularity to suppress dissolution of the to-be-processed film; and planarizing the to-be-processed film in a processing solution dissolving the film, by rotating the to-be-processed film and a processing body while the to-be-processed film contacting the processing body via the surface layer, removing the surface layer on convex portions of the irregularity while leaving the surface layer on concave portions of the irregularity and making dissolution degree of the convex portions larger than dissolution degree of the concave portions.

The forming the surface layer is possible by using the pretreatment unit. The planarizing the to-be-processed film is possible by using the polishing treatment unit 510.

Figure 8:
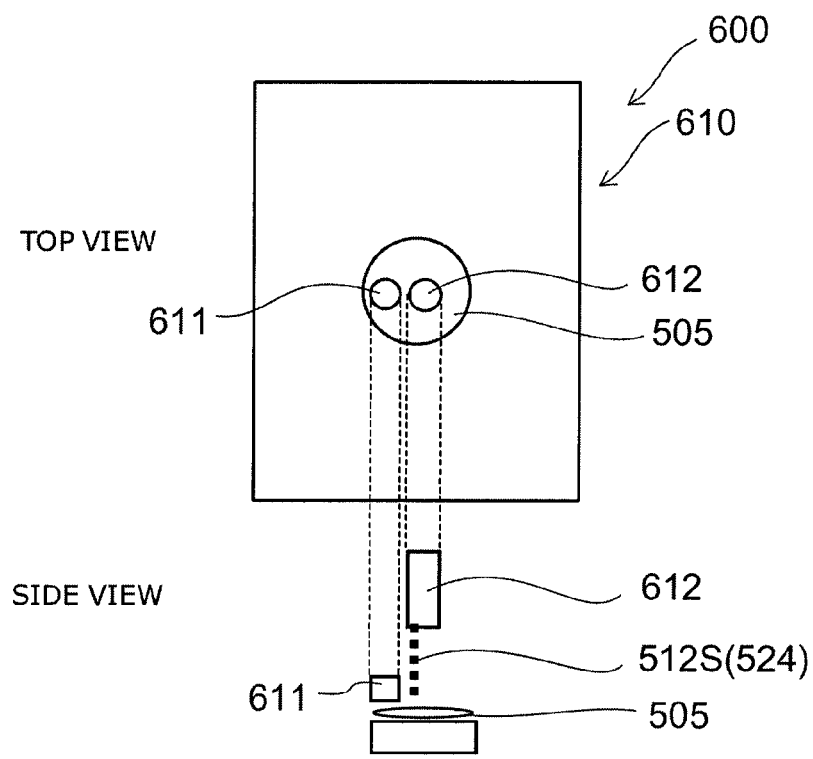
FIG. 8 is a schematic view showing another chemical planarization apparatus according to the fourth embodiment.

FIG. 8 is a schematic view illustrating another chemical planarization apparatus according to the fourth embodiment.

As shown in FIG. 8, another chemical planarization apparatus 600 according to the embodiment includes a pretreatment polishing unit 610. The pretreatment polishing unit 610 includes a pad 611 and a nozzle 612. The slurry 512s or the pretreatment solution is supplied from the nozzle toward the wafer 505 by switching to the slurry and the pretreatment solution. Also in the chemical planarization apparatus 600, the forming the surface layer and the planarizing the to-be-processed film is possible.

According to the embodiment, a method for chemical planarization and a chemical planarization apparatus, capable of suppressing generation of scratches, are provided.

Hereinabove, exemplary embodiments of the invention are described with reference to specific examples. However, the invention is not limited to these specific examples. Specific configurations of elements used in the chemical planarization method, such as, for example, the to-be-processed film 10, the surface layer, the processing solution and processing body are included in the scope of the invention, as long as those skilled in the art can carry out the invention in the same manner and achieve the same effects by suitably selecting them from a known scope.

Further, any two or more components of the specific examples may be combined within the extent of technical feasibility and are included in the scope of the invention to the extent that the purport of the invention is included.

Moreover, all chemical planarization methods which can be embodied by one skilled in the art by suitably changing design based on the chemical planarization methods described above as embodiments of the invention also are within the scope of the invention to the extent that the purport of the embodiments of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for chemical planarization, comprising:
   forming a surface layer on a to-be-processed film having irregularity, the to-be-processed film including convex portions and concave portions, the to-be-processed film being a silicon oxide film, the surface layer binding to or adsorbing onto the to-be-processed film along the irregularity to suppress dissolution of the to-be-processed film, the surface layer including first portions located on the convex portions and second portions located on the concave portions; and
   planarizing the to-be-processed film in a processing solution configured to dissolve the to-be-processed film, by rotating the to-be-processed film and a processing body including a catalyst material while the to-be-processed film contacts the processing body via the surface layer, removing at least a part of the first portions by oxidation with radicals near the catalyst material to expose at least a part of the convex portions, removing the first portions while leaving the second portions and making dissolution degree of the convex portions larger than dissolution degree of the concave portions.

2. The method according to claim 1, wherein the processing solution includes one of a hydrogen fluoride solution, an ammonium fluoride solution, and a strong alkaline solution.

3. The method according to claim 1, wherein the surface layer is one of a layer of a surfactant.

4. The method according to claim 1, wherein
   the processing solution includes a raw material for forming the surface layer, and
   the forming the surface layer includes forming the surface layer from the raw material by contacting the processing solution including the raw material with the to-be-processed film.

5. The method according to claim 1, wherein
   the surface layer is a layer of a surfactant, and
   the surfactant includes at least one of polyvinyl pyrrolidone and polyethyleneimine.

6. The method according to claim 5, wherein a weight average molecular weight of the polyvinyl pyrrolidone in terms of polyethylene glycol is not less than 20,000 and not more than 1,500,000.

7. The method according to claim 5, wherein a weight average molecular weight of the polyethyleneimine in terms of polyethylene glycol is not less than 10,000 and not more than 1,000,000.

8. The method according to claim 5, wherein the surfactant further includes polyacrylic acid.

9. The method according to claim 8, wherein a weight average molecular weight of the polyacrylic acid is not less than 2,000 and not more than 5,000,000.

10. The method according to claim 1, further including forming the to-be-processed film,
    the forming the to-be-processed film including one of a chemical vapor deposition method and a coating method.

11. The method according to claim 1, wherein
    the to-be-processed film is formed on a major surface of a base body, and
    the base body includes a part serving as at least one of a semiconductor memory, a high-speed logic LSI, a system LSI, and a memory-logic hybrid LSI.

12. The method according to claim 1, wherein the processing body is a polishing pad.

13. The method according to claim 1, wherein the processing body includes a resin material.

14. The method according to claim 1, wherein the processing body includes platinum (Pt).

15. The method according to claim 1, wherein
the surface layer is a layer of a surfactant, and
the surfactant includes at least one of functional groups of carboxylic acid type, sulfonic acid type, sulfate ester type, phosphate ester type, amine salt type, quarternary ammonium salt type, ether type, ester type, alkanolamide type, carboxybetaine type, and glycine type.

16. The method according to claim 1, wherein
the surface layer is a layer of a surfactant, and
the surfactant has a polarity opposite to the polarity of the to-be-processed film.

17. The method according to claim 1, wherein
the to-be-processed film is a silicon oxide film, and
the surface layer is a layer of a cationic surfactant.

18. The method according to claim 1, wherein the processing solution does not contain an abrasive grain.

19. The method according to claim 1, wherein the radicals include hydroxyl radicals.

20. The method according to claim 1, wherein the surface layer is a layer of at least one of a self-assembled monolayer and a water repellent layer.

* * * * *